(12) United States Patent
Hosaka

(10) Patent No.: US 12,214,529 B2
(45) Date of Patent: Feb. 4, 2025

(54) CONVEYANCE APPARATUS, PLANARIZATION APPARATUS, AND ARTICLE MANUFACTURING METHOD

(71) Applicant: CANON KABUSHIKI KAISHA, Tokyo (JP)

(72) Inventor: Takashi Hosaka, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 189 days.

(21) Appl. No.: 17/829,630

(22) Filed: Jun. 1, 2022

(65) Prior Publication Data

US 2023/0001608 A1 Jan. 5, 2023

(30) Foreign Application Priority Data

Jun. 30, 2021 (JP) ................. 2021-109414

(51) Int. Cl.
*B29C 43/58* (2006.01)
*B29C 43/18* (2006.01)
(Continued)

(52) U.S. Cl.
CPC ............ *B29C 43/58* (2013.01); *B29C 43/18* (2013.01); *B65G 43/08* (2013.01); *B65G 47/248* (2013.01);
(Continued)

(58) Field of Classification Search
CPC . B29C 43/58; B29C 43/18; B29C 2043/5825; B65G 43/08; B65G 47/248;
(Continued)

(56) References Cited

U.S. PATENT DOCUMENTS 5,420,931 A * 5/1995 Donner .................... H04R 5/02
381/86
6,873,087 B1 * 3/2005 Choi ..................... G03F 7/0002
310/323.17
(Continued)

FOREIGN PATENT DOCUMENTS

JP 2011529626 A 12/2011
KR 20030040378 A 5/2003
(Continued)

OTHER PUBLICATIONS

Office Action issued in Taiwanese Appln. No. 111119993 dated Apr. 30, 2024. English translation provided.
(Continued)

*Primary Examiner* — Mark A Deuble
(74) *Attorney, Agent, or Firm* — ROSSI, KIMMS & McDOWELL LLP

(57) ABSTRACT

A conveyance apparatus loads a pressing member to a planarization apparatus that forms a planarized film made of a material on a substrate by bringing a flat surface of the pressing member and the material on the substrate into contact with each other. The pressing member includes a first surface including the flat surface, and a second surface on an opposite side of the first surface. The conveyance apparatus comprises a determiner configured to perform determination as to whether a determination surface of the pressing member is the first surface or the second surface, and a controller configured to control the conveyance of the pressing member based on a result of the determination by the determiner.

13 Claims, 10 Drawing Sheets

(51) Int. Cl.
  *B65G 43/08* (2006.01)
  *B65G 47/248* (2006.01)
  *G01B 11/06* (2006.01)
(52) U.S. Cl.
  CPC .. *G01B 11/0675* (2013.01); *B29C 2043/5825* (2013.01); *B65G 2203/0225* (2013.01)
(58) Field of Classification Search
  CPC ........ B65G 2203/0225; G01B 11/0675; G03F 7/0002; G03F 7/70483; H01L 21/67092; H01L 21/67253; H01L 21/68; H01L 21/6838
  See application file for complete search history.

(56) References Cited

U.S. PATENT DOCUMENTS

| | | | |
|---|---|---|---|
| 6,954,275 | B2 | 10/2005 | Choi et al. |
| 7,128,516 | B2 * | 10/2006 | Sugiyama ........... H01L 21/6838 406/87 |
| 8,394,282 | B2 * | 3/2013 | Panga ................. G03F 7/70483 347/14 |
| 10,937,683 | B1 * | 3/2021 | Schlezinger ...... H01L 21/67715 |
| 2018/0240695 | A1 * | 8/2018 | Hayashi .............. G03F 7/70733 |
| 2020/0117096 | A1 * | 4/2020 | Kurosawa ......... H01L 21/67115 |
| 2024/0096687 | A1 * | 3/2024 | Penmethsa ............. C23C 14/50 |

FOREIGN PATENT DOCUMENTS

| | | |
|---|---|---|
| KR | 1020180012214 A | 2/2018 |
| KR | 1020190047321 A | 5/2019 |
| TW | 202023786 A | 7/2020 |
| WO | 2009151560 A2 | 12/2009 |

OTHER PUBLICATIONS

Office Action issued in Taiwanese Appln. No. 111119993, dated Nov. 1, 2024. English translation provided.

\* cited by examiner

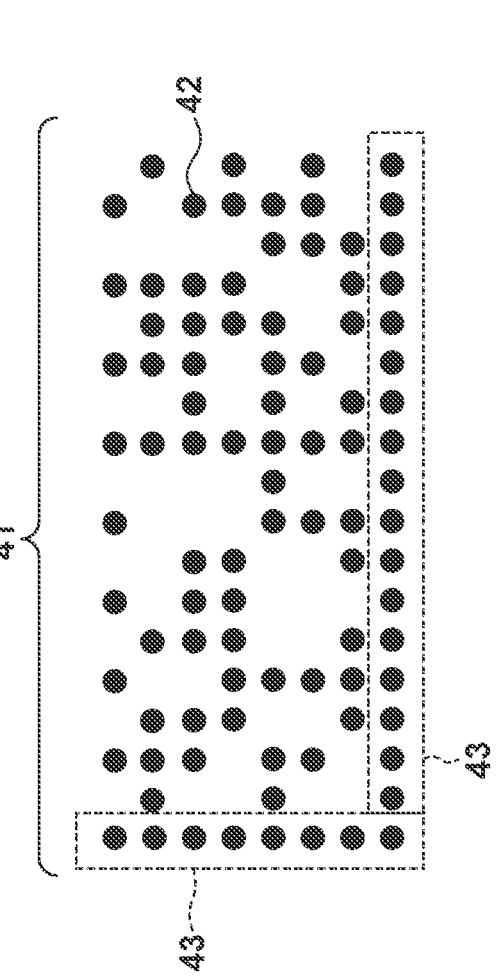
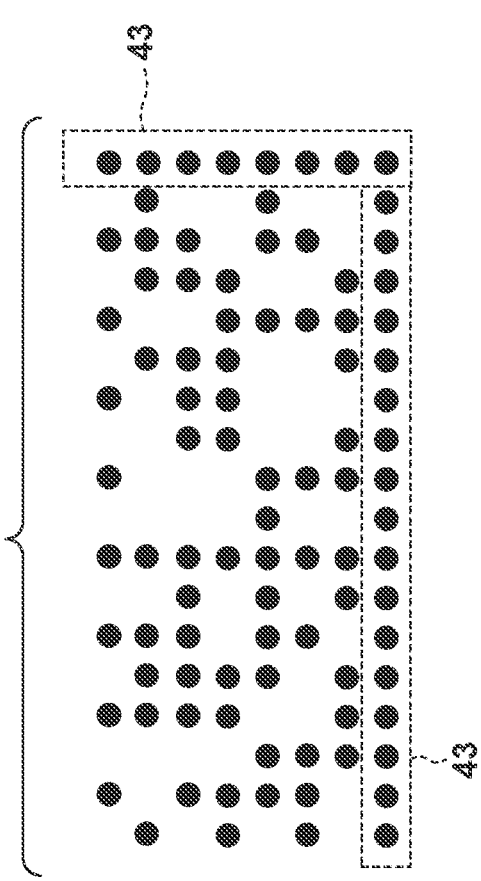
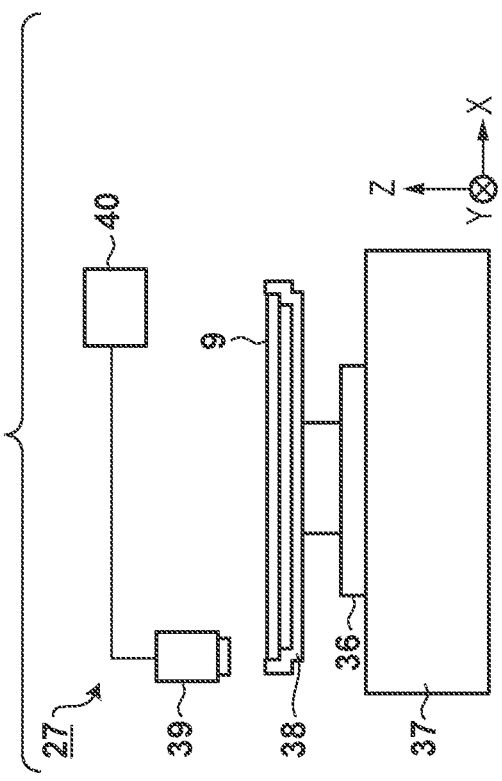
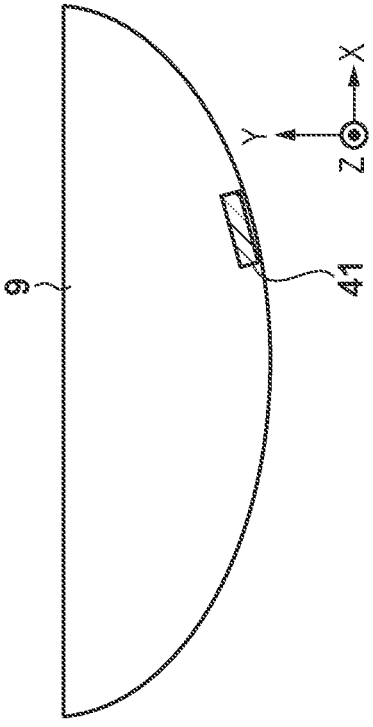

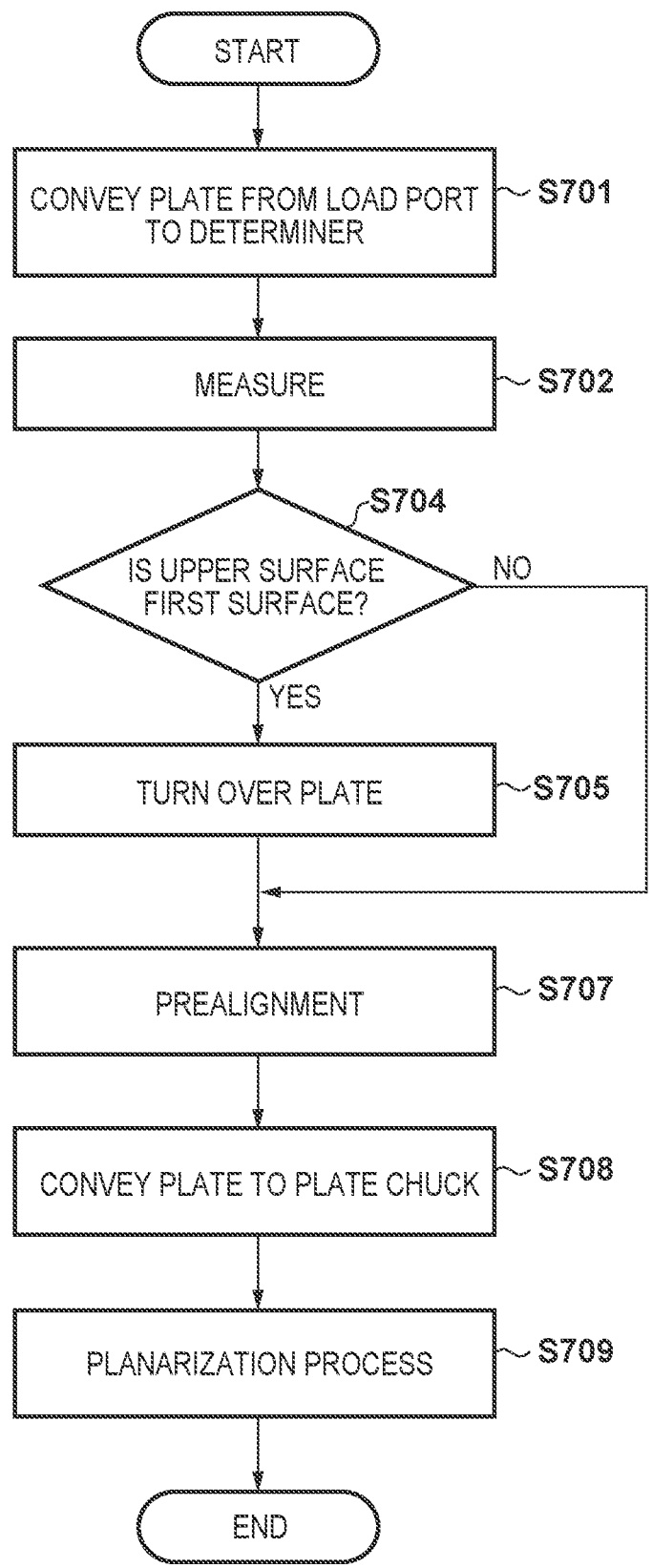

F I G. 7A
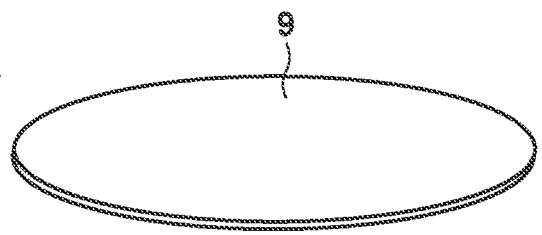
F I G. 7B
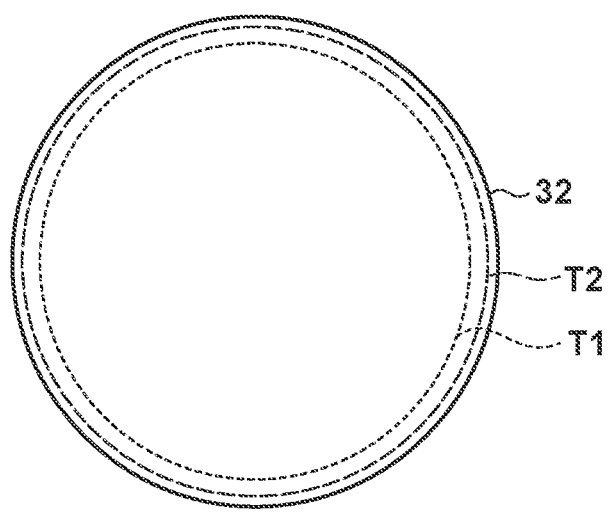
F I G. 7C
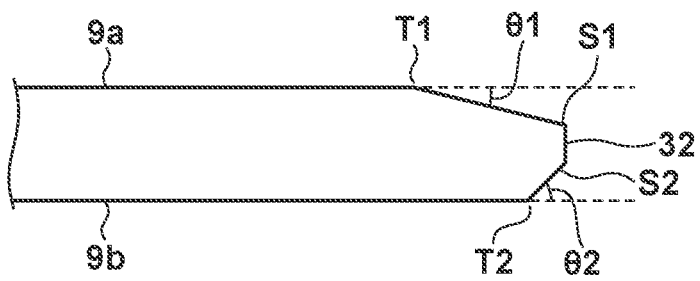

CONVEYANCE APPARATUS, PLANARIZATION APPARATUS, AND ARTICLE MANUFACTURING METHOD

BACKGROUND OF THE INVENTION

Field of the Invention

The present invention relates to a conveyance apparatus, a planarization apparatus, and an article manufacturing method.

Description of the Related Art

As a technique capable of producing a microstructured device according to a design rule on the nanometer order and suitable for mass production, an imprint technique is being put into practical use. The imprint technique is a technique in which a mold (to be also referred to as a template) including a pattern having a nanometer-scale concave-convex structure formed using an electron beam drawing apparatus, an exposure apparatus, or the like is brought into contact with a formable material (imprint material) on a substrate to transfer the pattern. A photo-curing method is one example of the imprint technique. An imprint apparatus employing the photo-curing method forms, using a mold, a photo-curable imprint material supplied in a shot region on a substrate, cures the imprint material by light irradiation, and separates the mold from the cured imprint material, thereby forming a pattern on the substrate.

Further, there is conventionally known a technique (planarization technique) for planarizing a step of a substrate by forming a coating film on the substrate using a coating device such as a spin coater. However, the planarization technique using the coating device is insufficient to planarize the step of the substrate on a nanoscale. Thus, in recent years, it is proposed to planarize the substrate using the imprint technique. Japanese Patent Laid-Open No. 2011-529626 describes that a composition is dropped based on the step of a substrate and the composition is cured in a state in which a plate is in contact with the dropped composition, thereby achieving the improved planarization accuracy.

The planarization using the imprint technique can include a step of curing the composition by light irradiation in the state in which the plate serving as a pressing member is in contact with the composition on the substrate. Therefore, a material such as silica glass that transmits light is used for the plate. Since the purpose is planarization, the surface of the plate to be in contact with the composition on the substrate is a flat surface which has no physical object such as a convex-concave pattern and no feature. Further, the surface on the opposite side of the flat surface is also a flat surface. Accordingly, there is a problem that it is difficult to visually judge the upper surface/lower surface state of the plate. If the plate in a wrong state is loaded to a planarization apparatus, a trouble can occur in the planarization apparatus. For example, if the plate in a turn-over state is loaded to the planarization apparatus, the surface of the plate to be in contact with the composition on the substrate can be scratched and damaged during the conveyance in the planarization apparatus, and the plate can become unusable. Further, scratches or dust adhering to the plate may damage the pattern formed on the substrate during the planarization process.

SUMMARY OF THE INVENTION

The present invention provides a technique advantageous in reducing troubles caused by loading a pressing member in a wrong state to a planarization apparatus that forms a planarized film on a substrate using the pressing member.

The present invention in its one aspect provides a conveyance apparatus that loads a pressing member to a planarization apparatus that forms a planarized film made of a material on a substrate by bringing a flat surface of the pressing member and the material on the substrate into contact with each other, the pressing member including a first surface including the flat surface, and a second surface on an opposite side of the first surface, the conveyance apparatus comprising a determiner configured to perform determination as to whether a determination surface of the pressing member is the first surface or the second surface, and a controller configured to control the conveyance of the pressing member based on a result of the determination by the determiner.

Further features of the present invention will become apparent from the following description of exemplary embodiments (with reference to the attached drawings).

BRIEF DESCRIPTION OF THE DRAWINGS

FIGS. 4A to 4D are views for explaining a method of performing plate front/back determination;

FIG. 5 is a flowchart illustrating an operation of the planarization apparatus;

FIGS. 7A to 7C are views showing an example of an inclined portion formed in a plate outer edge portion;

DESCRIPTION OF THE EMBODIMENTS

Figure 1:
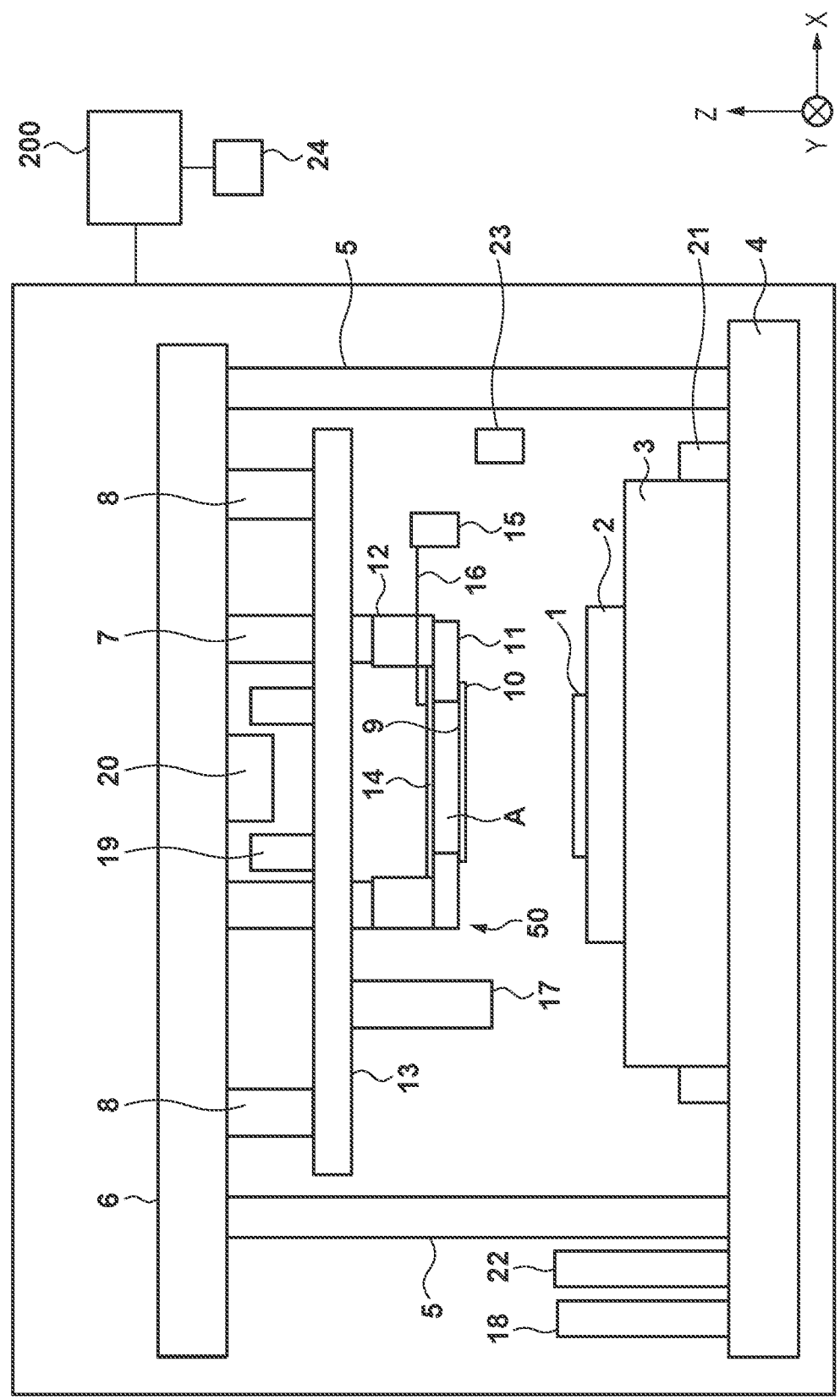
FIG. 1 is a view showing the arrangement of planarization apparatus.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

First Embodiment

FIG. 1 is a schematic view of a planarization apparatus 100 according to an embodiment. In the specification and the drawings, directions will be indicated on an XYZ coordinate system in which a horizontal surface is defined as the X-Y plane. In general, a substrate 1 serving as an object to be processed is placed on a substrate stage 3 such that the surface of the substrate 1 is parallel to the horizontal surface (X-Y plane). Therefore, in the following description, the directions orthogonal to each other in a plane along the surface of the substrate 1 are the X-axis and the Y-axis, and the direction perpendicular to the X-axis and the Y-axis is the Z-axis. Further, in the following description, directions parallel to the X-axis, the Y-axis, and the Z-axis of the XYZ coordinate system are referred to as the X direction, the Y direction, and the Z direction, respectively, and a rotational direction around the X-axis, a rotational direction around the Y-axis, and a rotational direction around the Z-axis are referred to as the θX direction, the θY direction, and the θZ direction, respectively.

The underlying pattern on the substrate has a concave-convex profile derived from a pattern formed in the previous step. More particularly, a process substrate may have a step of about 100 nm along with a multilayer structure of a recent memory element. The step derived from the moderate undulation of the entire surface of the substrate can be corrected by the focus tracking function of a scan exposure apparatus used in the photo process. However, the fine concave/convex portions having a pitch small enough to fall within the exposure slit area of the exposure apparatus may fall outside the DOF (Depth Of Focus) of the exposure apparatus. As a conventional method of planarizing the underlying pattern of the substrate, a method of forming a planarized layer, such as SOC (Spin On Carbon) or CMP (Chemical Mechanical Polishing), is used. However, the conventional technique undesirably cannot obtain sufficient planarization performance, and the concave/convex difference of the underlayer by multilayer formation tends to increase.

In order to solve this problem, studies have been conducted on a planarization apparatus that planarizes a substrate by using an imprint technique. The planarization apparatus locally performs planarization within a substrate plane by bringing a flat surface of a member or a member (flat template) on which no pattern is formed into contact with an uncured composition supplied to the substrate in advance. Subsequently, the composition is cured while the composition is in contact with the flat template, and the flat template is separated from the cured composition. This forms a planarized layer on the substrate. Since the planarization apparatus using the imprint technique is configured to drop a composition in an amount corresponding to the step of the substrate, it is expected to improve the planarization accuracy as compared with the existing methods.

The planarization apparatus 100 in FIG. 1 can be embodied by a forming apparatus that forms a composition on the substrate 1 using a plate 9 serving as a pressing member. The planarization apparatus 100 cures the composition in a state in which the material on the substrate 1 and the plate 9 are in contact with each other, and separates the plate 9 from the cured composition, thereby forming a planarized layer made of the material on the substrate 1.

The substrate 1 can be, for example, a silicon wafer, but is not limited thereto. The substrate 1 can be formed of a material arbitrarily selected from aluminum, a titanium-tungsten alloy, an aluminum-silicon alloy, an aluminum-copper-silicon alloy, silicon oxide, silicon nitride, and the like. Note that a substrate on which an adhesion layer has been formed by surface treatment such as silane coupling treatment, silazane treatment, film formation of an organic thin film, or the like to improve the adhesiveness to the composition may be used as the substrate 1. Note that the substrate 1 typically has a circular shape with a diameter of 300 mm, but is not limited thereto.

The plate 9 can be formed of a light transmissive material in consideration of the light irradiation step. Such a material can be, for example, glass, quartz, PMMA (Polymethyl methacrylate), a phototransparent resin such as a polycarbonate resin, a transparent metal vapor deposition film, a flexible film such as polydimethylsiloxane, a photo-curable film, a metal film, or the like. Note that the plate 9 preferably has a circular shape with a diameter larger than 300 mm and smaller than 500 mm, but is not limited thereto. The thickness of the plate 9 is preferably 0.25 mm or more and less than 2 mm, but is not limited thereto.

The composition can be a curable composition cured by light irradiation, for example, a UV-curable liquid. As the UV-curable liquid, typically, a monomer such as acrylate or methacrylate can be used. The curable composition may be referred to as a formable material. In the following description, the formable material will be simply referred to as the "material".

As shown in FIG. 1, the planarization apparatus 100 includes a substrate chuck 2, the substrate stage 3, a base plate 4, support columns 5, a top plate 6, guide bars 7, support columns 8, a plate chuck 11, a head 12, and an alignment shelf 13. The planarization apparatus 100 further includes a pressure regulator 15, a supplier 17, a substrate conveyer 18, an alignment scope 19, a light source 20, a stage driving device 21, a plate conveyer 22, a cleaning device 23, an input device 24, and a controller 200. The substrate chuck 2 and the substrate stage 3 can hold and move the substrate 1. The plate chuck 11 and the head 12 can hold and move the plate 9.

Note that a conveyer may be provided as each of the plate conveyer 22 for the plate 9 and the substrate conveyer 18 for the substrate 1, but may be shared. Further, in this embodiment, the plate conveyer 22 and the substrate conveyer 18 are described as a part of the planarization apparatus 100. However, a conveyer may be provided as an external apparatus of the planarization apparatus 100 and convey the plate 9 and the substrate 1 to the planarization apparatus 100.

The substrate 1 is loaded from the outside of the planarization apparatus 100 by the substrate conveyer 18 including a conveyance hand or the like, and held by the substrate chuck 2. The substrate stage 3 is supported by the base plate 4, and driven in the X direction and the Y direction to position the substrate 1 held by the substrate chuck 2 at a predetermined position. The stage driving device 21 includes, for example, a linear motor or an air cylinder, and drives the substrate stage 3 in at least the X direction and the Y direction. However, the stage driving device 21 may have a function of driving the substrate stage 3 in two or more axis directions (for example, six axis directions). Further, the stage driving device 21 includes a rotation mechanism, and can rotate and drive the substrate chuck 2 or the substrate stage 3 in the θZ direction.

The plate 9 serving as the pressing member is loaded from the outside of the planarization apparatus 100 by the plate conveyer 22 (conveyance apparatus) including a conveyance hand or the like, and held by the plate chuck 11. The plate 9 has, for example, a circular or rectangular outer shape, and includes a first surface including a flat surface 10 to be in contact with the material arranged on the substrate, and a second surface on the opposite side of the first surface. The size of the flat surface 10 is equal to or larger than that of the substrate 1. The plate chuck 11 is supported by the head 12, and has a function of correcting the θZ-direction position (an inclination about the Z-axis) of the plate 9. Each of the plate chuck 11 and the head 12 includes an opening through which light (ultraviolet light) applied from the light source 20 via a collimator lens passes. The plate chuck 11 functions as a holder that mechanically holds the plate 9. For example, the plate chuck 11 holds the plate 9 by chucking the second surface in a state in which the second surface of the plate 9 faces upward. The head 12 mechanically holds the plate chuck 11. The plate chuck 11 and the head 12 form a forming device 50 that performs a forming process of a planarized film. The head 12 forms a driving mechanism (not shown) for positioning the spacing between the substrate 1 and the plate 9 upon bringing the plate 9 into contact with the material on the substrate 1 and separating the plate 9 from the material, and moves the plate 9 in the Z direction. The driving mechanism of the head 12 can be formed by, for example, an actuator such as a linear motor, an air cylinder, or a voice coil motor. A load cell for measuring the pressing force (imprinting force) of the plate 9 against the material on the substrate can be arranged in the plate chuck 11 or the head 12. A plate deforming mechanism (plate deforming device) includes a sealing member 14 that makes a space region A, which is formed by the space existing inside the plate chuck 11 and the internal space surrounded by the plate 9, a sealed space. The plate deforming mechanism also includes the pressure regulator 15 which is installed outside the plate chuck 11 and regulates the pressure in the space region A. The sealing member 14 is formed by a light transmissive flat plate member such as silica glass, and partially includes a connection port (not shown) of a tube 16 connected to the pressure regulator 15. The pressure regulator 15 can increase the amount of convex deformation of the plate 9 toward the substrate side by increasing the pressure in the space region A. Further, the pressure regulator 15 can decrease the amount of convex deformation of the plate 9 by decreasing the pressure in the space region A. The support columns 5 for supporting the top plate 6 are arranged on the base plate 4. The guide bars 7 are suspended from the top plate 6, extend through the alignment shelf 13, and are fixed to the head 12. The alignment shelf 13 is suspended from the top plate 6 via the support columns 8. The guide bars 7 extend through the alignment shelf 13. Further, the alignment shelf 13 is arranged with a height measurement system (not shown) which is used to measure the height (flatness) of the substrate 1 held by the substrate chuck 2 using, for example, an obliquely incident image shift method.

The alignment scope 19 includes an optical system and an image capturing system used to observe a reference mark provided on the substrate stage 3 and an alignment mark provided in the plate 9. However, if no alignment mark is provided in the plate 9, no alignment scope 19 may be provided. The alignment scope 19 is used for alignment in which the relative positions of the reference mark provided on the substrate stage 3 and the alignment mark provided in the plate 9 are measured and the positional shift therebetween is corrected.

The supplier 17 includes a dispenser including discharge ports (nozzles) which discharge a material in an uncured state to the substrate 1, and supplies (applies) the material onto the substrate. The supplier 17 employs, for example, a piezo jet method, a micro solenoid method, or the like, and can supply a material of a small volume such as 1 pL (pico liter) onto a substrate. Note that the number of the discharge ports in the supplier 17 is not limited. The supplier 17 may include one nozzle (single nozzle), or may include a plurality of (for example, 100 or more) nozzles. The plurality of nozzles may form a linear nozzle array including one row or a plurality of rows.

The cleaner 23 cleans the plate 9 in a state in which the plate 9 is held by the plate chuck 11. In this embodiment, the cleaner 23 removes the material having adhered to the plate 9, particularly, the flat surface 10 upon separating the plate 9 from the cured material on the substrate. For example, the cleaner 23 may wipe off the material adhering to the plate 9, or may remove the material adhering to the plate 9 using UV irradiation, wet cleaning, dry plasma cleaning, or the like.

The controller 200 is formed by a computer apparatus including a CPU and a memory, and controls the entire planarization apparatus 100. The controller 200 functions as a processor that comprehensively controls the respective units of the planarization apparatus 100 to perform a planarization process. Here, the planarization process is a process of planarizing a material by bringing the flat surface 10 of the plate 9 into contact with the material on the substrate to make the flat surface 10 follow the surface shape of the substrate 1. Note that the planarization process is generally performed on a lot basis, that is, for each of a plurality of substrates included in a single lot.

Figure 2A:
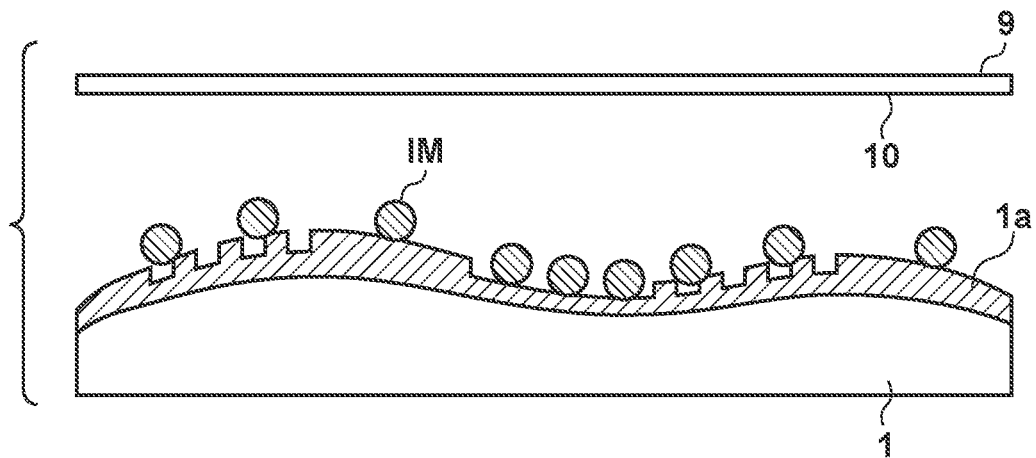
FIGS. 2A to 2C are views for explaining a planarization process.
Figure 2B:
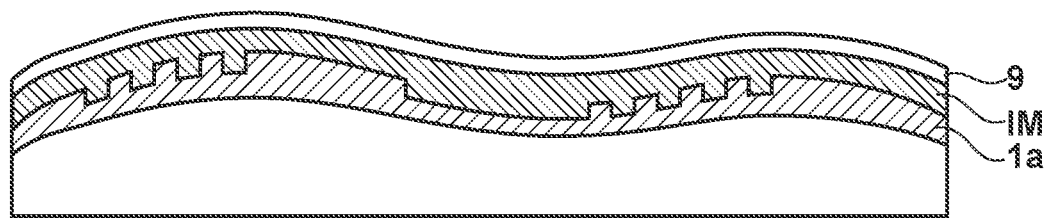
Figure 2C:
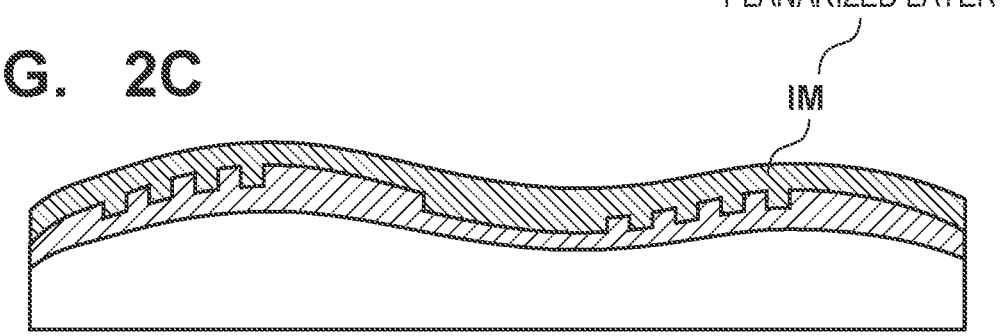

Next, with reference to FIGS. 2A to 2C, the planarization process will be described. First, a material IM is supplied by the supplier 17 onto the substrate 1 formed with an underlying pattern 1a. FIG. 2A shows a state after the material IM is arranged on the substrate and before the plate 9 is brought into contact thereto. Next, as shown in FIG. 2B, the material IM on the substrate 1 and the flat surface 10 of the plate 9 are brought into contact with each other. When the plate 9 presses the material IM, the material IM spreads over the entire surface of the substrate 1. FIG. 2B shows a state in which the entire surface of the flat surface 10 of the plate 9 is in contact with the material IM on the substrate 1 so that the flat surface 10 of the plate 9 follows the surface shape of the substrate 1. Then, in the state shown in FIG. 2B, light is applied from the light source 20 to the material IM on the substrate 1 via the plate 9, and this cures the material IM. After this, the plate 9 is separated from the cured material IM on the substrate 1. Thus, the layer (planarized layer) of the material IM having a uniform thickness over the entire surface of the substrate 1 is formed. FIG. 2C shows a state in which a planarized layer made of the material IM is formed on the substrate 1. In the following description, bringing the flat surface 10 of the plate 9 and the material IM on the substrate into contact (tight contact) with each other or separating them from each other are simply represented as bringing the plate 9 and the material IM on the substrate into contact (tight contact) with each other or separating them from each other, respectively.

Figure 3:
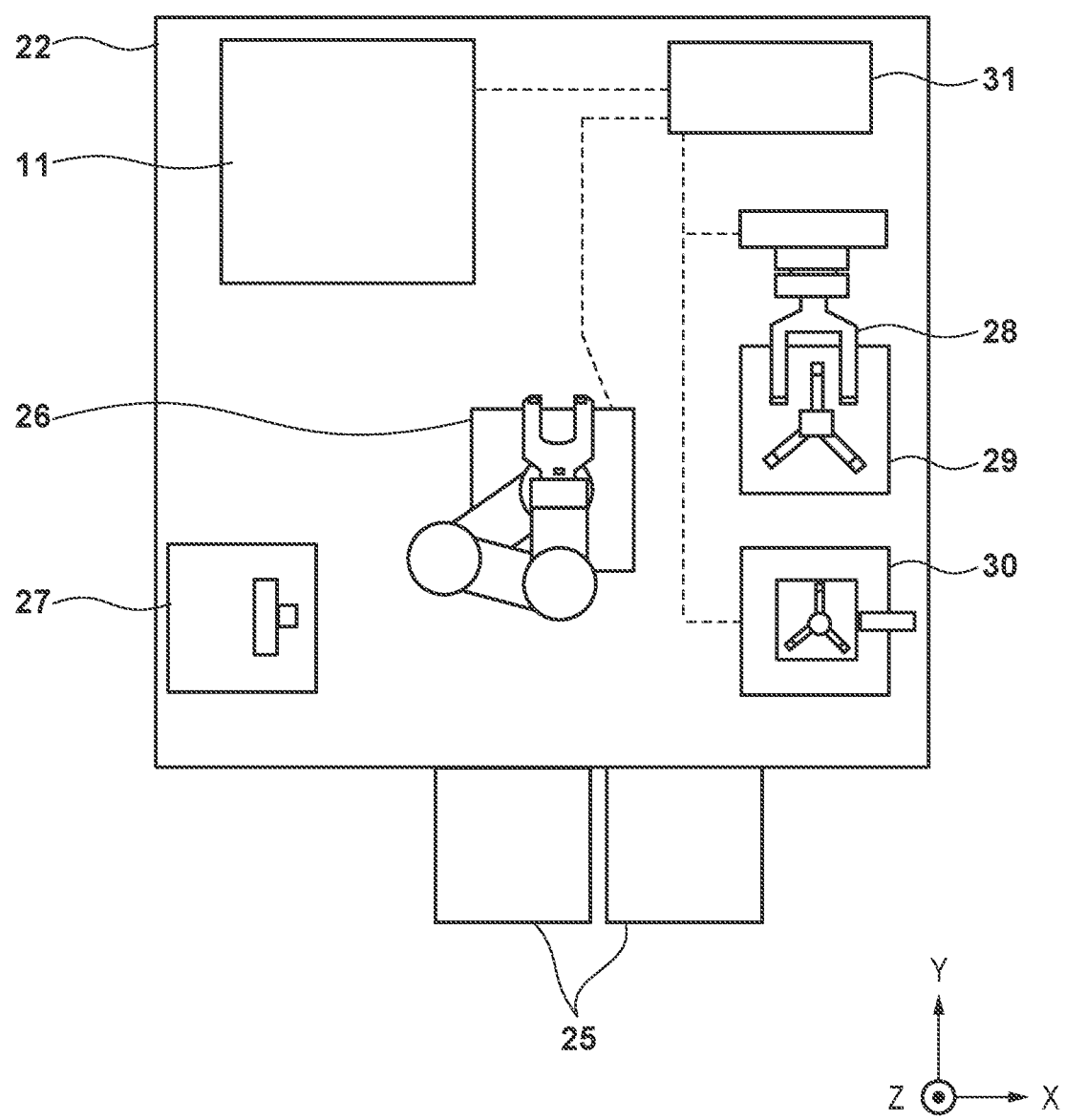
FIG. 3 is a view for explaining conveyance of a plate by a plate conveyer.

Next, with reference to FIG. 3, plate conveyance will be described. FIG. 3 is a view exemplarily showing the components related to the plate conveyer 22 (conveyance apparatus). Transfer of the plate between the inside and the outside of the planarization apparatus 100 is performed via a load port 25. The load port 25 is an interface unit for moving the substrate in an FOUP into and out of the planarization apparatus 100. In this embodiment, the plate is stored in the FOUP. Note that the plate 9 to be replaced after performing the planarization process is also unloaded from the load port 25 to the outside of the apparatus. A conveyance hand 26 grasps and conveys the plate 9. The conveyance hand 26 may include an edge clamp and a vacuum suction mechanism using a pad for holding the plate 9. The conveyance hand 26 obtains the plate 9 loaded from the load port 25 and conveys it to a determiner 27. The determiner 27 determines whether the upper surface (determination surface) of the plate placed on a predetermined placement surface is the first surface (the surface to be in contact with the substrate 1, which is also referred to as the "front surface") including the flat surface 10, or the second surface (the surface to be in contact with the plate chuck 11, which is also referred to as the "back surface") on the opposite side of the first surface (this determination is also referred to as "front/back determination" below). In accordance with the result of the determination by the determiner 27, the plate 9 can be conveyed to a reversing device 28 by the conveyance hand 26. The reversing device 28 turns over the plate 9 (reverses the plate 9). The reversing device 28 can include a grasping mechanism for grasping the plate 9, and a pivot mechanism that causes the grasping mechanism to pivot 180°. The reversing device 28 can further include a holding mechanism 29 for temporarily holding the reversed plate. The plate 9 normally placed on the holding mechanism 29 such that the lower direction of the plate becomes the first surface (front surface) and the upper direction of the plate becomes the second surface (back surface) can be obtained by the conveyance hand 26 and conveyed to an adjuster 30. The adjuster 30 adjusts the prealignment state of the plate 9. For example, the adjuster 30 performs alignment regarding the center position and rotational direction of the plate 9 such that the feeding position upon conveying the plate 9 to the plate chuck 11 is kept constant. Therefore, the adjuster 30 may be called a prealigner. The adjuster 30 can include a driving stage, a plate chuck, and a measurement device. The driving stage can include driving mechanisms for the X direction, the Y direction, the Z direction, the θX direction, the θY direction, and the θZ direction, respectively. The plate chuck chucks and holds the plate 9 by a chuck pad or the like. Note that as the chucking method, vacuum suction, electrostatic attraction, or another chucking method may be used. The alignment (prealignment) of the plate can be performed by obtaining the positional information of the plate outer peripheral portion by the measurement device while rotating the plate. Note that the measurement device can include, for example, an image capturing device such as a CCD camera, and a processing device that processes an image and detects the position of an object on the image.

The conveyance hand 26 obtains the plate 9 whose prealignment state has been adjusted by the adjuster 30, and conveys it to the plate chuck 11 in the forming device. After the planarization process is performed in the forming device, the conveyance hand 26 obtains the plate 9 form the plate chuck 11, and conveys it to the FOUP of the load port 25.

Note that it may be configured that the plate 9 having undergone the planarization process is loaded to the determiner 27 by the conveyance hand 26 and the front/back determination of the plate is performed. Alternatively, the front/back determination may not be performed in the procedure of a series of plate conveyance, but the front/back determination of the plate may be performed by the determiner 27 only during specific conveyance at the time such as when the planarization apparatus is turned on next time after a power failure or power cut-off of the planarization apparatus. A control device 31 controls the operations of the plate chuck 11, the reversing device 28, the conveyance hand 26, the adjuster 30, the load port 25, and the determiner 27. The control device 31 may be implemented by the controller 200.

With reference to FIGS. 4A to 4D, a method of performing plate front/back determination by the determiner 27 will be described. FIG. 4A is a view showing the arrangement of the determiner 27. The determiner 27 can include a driving stage 36, a supporter 37, a plate chuck 38, a camera 39 (image capturing device), and an image processing device 40. The driving stage 36 includes a driving mechanism for the X and Y directions and a driving mechanism for the θZ direction (both are not shown). The supporter 37 supports the driving stage 36. The plate chuck 38 holds the plate 9. The camera 39 is arranged at a position where it can capture the outer peripheral portion of the plate 9. The plate 9 placed on the plate chuck 38 (the predetermined placement surface) by the conveyance hand 26 is held by the plate chuck 38.

As will be described later, a mark for identifying the first surface (front surface) or the second surface (back surface) of the plate 9 is formed in the outer peripheral portion (the region on the outer periphery side of the flat surface 10) of the plate 9. The camera 39 captures the mark. More specifically, the outer peripheral portion of the plate 9 is captured by the camera 39 while rotating the driving state 36 in the θZ direction. The image obtained by the camera 39 is transferred to the image processing device 40. The image processing device 40 performs the front/back determination by processing the image of the mark extracted from the image obtained by the camera 39.

FIG. 4B shows a portion of the plate 9. A mark 41 for identifying the first surface (front surface) or the second surface (back surface) of the plate 9 is formed in the outer peripheral portion of the plate 9. Since the mark 41 is formed in the region on the outer periphery side of the flat surface 10, the mark 41 does not hinder planarization. The mark 41 can be, for example, a T7 mark complying with the SEMI standard. This mark is formed by a two-dimensional binary data matrix code symbol having a rectangular outer shape, and can be read by machine. The mark 41 includes a plurality of code symbols (dots) arranged asymmetrically. FIG. 4C shows an arrangement example of the mark 41. The mark 41 is formed by a plurality of dots 42. Each of the plurality of dots 42 is a local area having a refractive index different from that in the surrounding surface, and written in the plate 9 by, for example, a laser. A solid border 43 is a set of the dots arranged in an L-shape in the end portions of the mark 41. FIG. 4C shows the mark 41 in a case in which the upper surface of the plate 9 placed on the plate chuck 38 forming a predetermined placement surface is the first surface. In this case, the shape of the solid border 43 is recognized as an L-shape. On the other hand, FIG. 4D shows the mark 41 in a case in which the upper surface of the plate 9 placed on the plate chuck 38 is the second surface, that is, in a case in which the plate 9 is placed in the opposite direction to the direction in FIG. 4C. In this case, the shape of the solid border 43 is recognized as an inverted L-shape. Therefore, the front/back determination can be performed by the image processing device 40 detecting the mark 41 from the image and recognizing the shape of the solid border 43 in the detected mark 41.

Note that the mode of the mark 41 is not limited to that shown in FIG. 4C, and only required to have a feature that enables the front/back determination of the plate. For example, the mark 41 may be a directional notch formed in the outer peripheral portion of the plate.

FIG. 5 is a flowchart illustrating an operation of the planarization apparatus 100 from plate loading to a planarization process.

In step S701, the control device 31 controls the conveyance hand 26 to obtain the plate 9 placed in the load port 25 and convey it to the determiner 27. The conveyed plate 9 is placed on the plate chuck 38 and held by the plate chuck 38.

In step S702, the control device 31 controls the determiner 27 to measure the mark of the plate 9. The measurement is performed by capturing the outer peripheral portion of the plate 9 by the camera 39 while rotating the driving stage 36 in the θZ direction. The image obtained by the camera 39 is transferred to the image processing device 40. The image processing device 40 extracts the image of the mark from the image obtained by the camera 39.

In step S704, for example, by recognizing the orientation of the solid border 43 in the extracted image of the mark, the image processing device 40 determines whether the upper surface of the plate 9 placed on the plate chuck 38 is the first surface (front surface) or the second surface (back surface). If it is determined that the upper surface of the plate 9 is the first surface, the control device 31 controls the conveyance hand 26 to convey the plate 9 to the reversing device 28 in step S705. The reversing device 28 turns over the plate 9 (reverses the plate 9). With this, the upper surface of the plate 9 becomes the second surface, and the lower surface becomes the first surface. After this, in step S707, the control device 31 controls the conveyance hand 26 to convey the plate 9 to the adjuster 30. If it is determined in step S704 that the upper surface of the plate 9 is the second surface (back surface), the plate 9 is conveyed to the adjuster 30 without reversing the plate 9 by the reversing device 28. Note that the next conveyance destination may be set in advance in accordance with the front/back state of the plate 9, or the state may be notified to the user and the user may be allowed to select the conveyance destination.

In step S707, the adjuster 30 adjusts the prealignment state of the conveyed plate 9. After this, in step S708, the control device 31 controls the conveyance hand 26 to convey the plate 9 adjusted by the adjuster 30 to the forming device 50 (more specifically, immediately below the plate chuck 11). Thus, the plate chuck 11 chucks the second surface in a state in which the second surface of the plate 9 faces upward, and holds the plate 9.

Thereafter, the controller 200 controls the forming device 50 to perform the planarization process on the substrate 1 using the plate 9.

Note that the sequence has been described here in which the plate 9 is finally conveyed to the plate chuck 11 regardless of the result of the front/back determination of the plate 9 performed by the determiner 27. However, the present invention is not limited to this. For example, the user can make setting such that, if it is determined that the plate 9 is in a wrong state (the upper surface of the plate 9 is the first surface), the plate 9 is immediately unloaded. If such the setting has been made and it is determined in step S704 that the upper surface of the plate 9 is the second surface, this may be determined as an abnormal state and the conveyance hand 26 may convey the plate 9 to the load port 25. Further, in this case, an alarm notifying the occurrence of the abnormal state may be output.

The adjuster 30 is not necessarily installed in the planarization apparatus 100, and may be provided outside the planarization apparatus 100. If the adjuster 30 is provided outside the planarization apparatus 100, the plate is loaded into the planarization apparatus 100 in a state in which the prealignment state is adjusted in advance. In this case, the processing in step S707 is eliminated, and the plate 9 reversed by the reversing device 28 is directly conveyed to the forming device 50. If it is determined by the determiner 27 that the upper surface of the plate 9 is the second surface (NO in step S704), the plate 9 is conveyed to the forming device 50 (not to the adjuster 30).

Figure 6:
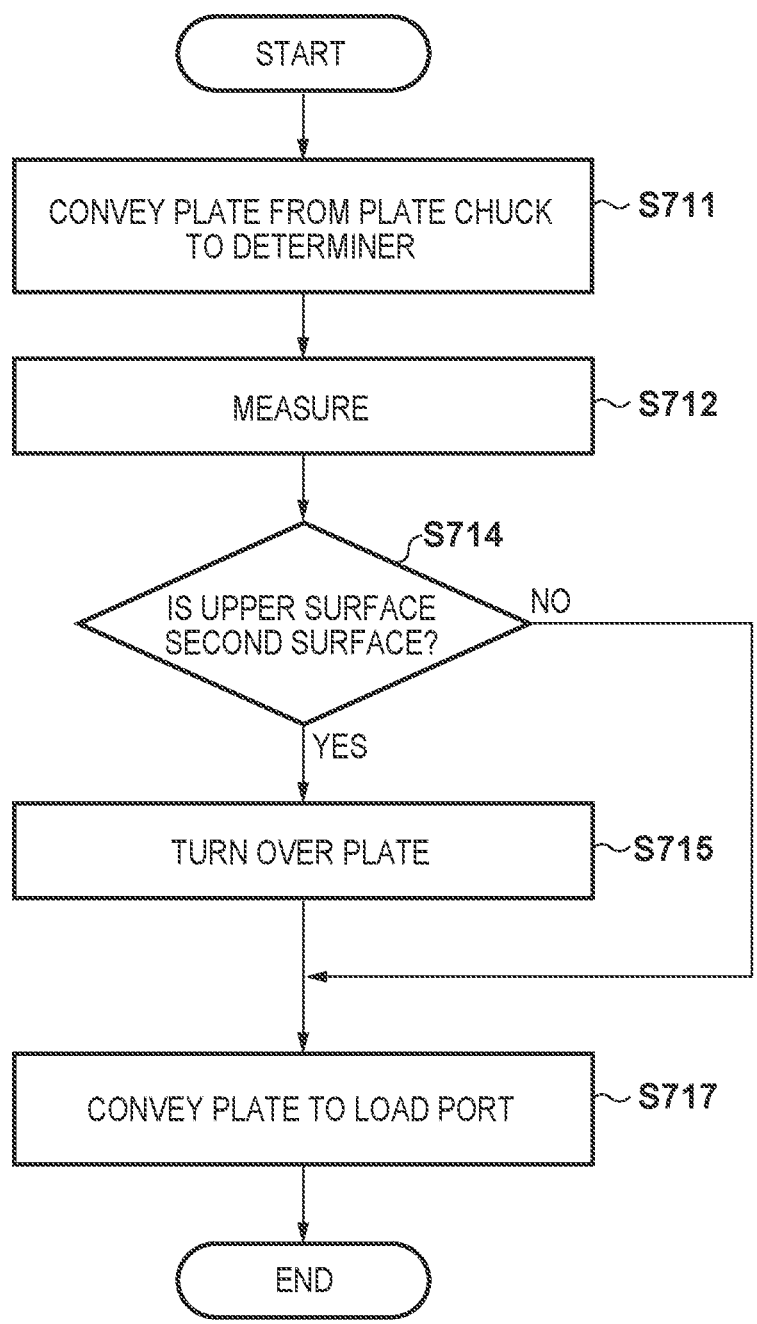
FIG. 6 is a flowchart illustrating another operation of the planarization apparatus.

The case in which the front/back determination of the plate 9 is performed before the planarization process (step S709) is illustrated in FIG. 5, but the front/back determination of the plate 9 may be performed after the planarization process as illustrated in FIG. 6. FIG. 6 is a flowchart illustrating the process up to plate unloading after the planarization process.

In step S711, the control device 31 controls the conveyance hand 26 to obtain the plate 9 on the plate chuck 11 and convey it to the determiner 27. The conveyed plate 9 is placed on the plate chuck 38 and held by the plate chuck 38.

In step S712, the control device 31 controls the determiner 27 to measure the mark of the plate 9. The measurement is performed by capturing the outer peripheral portion of the plate 9 by the camera 39 while rotating the driving stage 36 in the θZ direction. The image obtained by the camera 39 is transferred to the image processing device 40. The image processing device 40 extracts the image of the mark from the image obtained by the camera 39.

In step S714, for example, by recognizing the orientation of the solid border 43 in the extracted image of the mark, the image processing device 40 determines whether the upper surface of the plate 9 placed on the plate chuck 38 is the first surface (front surface) or the second surface (back surface). If it is determined that the upper surface of the plate 9 is the second surface, the control device 31 controls the conveyance hand 26 to convey the plate 9 to the reversing device 28 in step S715. The reversing device 28 turns over the plate 9 (reverses the plate 9). With this, the upper surface of the plate 9 becomes the first surface, and the lower surface becomes the second surface. After this, in step S717, the control device 31 controls the conveyance hand 26 to convey the plate 9 to the load port 25 (a carrier arranged in the load port 25).

The example in which the front/back determination of the plate 9 is performed after the planarization process has been described above with reference to FIG. 6. The front/back determination of the plate and reversing the plate accordingly may be performed before the planarization process, may be performed after the planarization process, or may be performed before and after the planarization process. Note that although the conveyance of the plate 9 to the adjuster 30 and the alignment thereof are not described in the procedure of FIG. 6, if the plate 9 is likely to cause physical interference in the unloading path, the alignment step may be included.

According to the above-described process, it is possible to reduce troubles caused by loading the plate in a wrong state to the planarization apparatus.

Second Embodiment

A front/back determination method of a plate 9 according to the second embodiment will be described. In the second embodiment, an inclined portion is formed in the outer edge portion of at least the first surface of the plate, and a determiner 27 performs the front/back determination by detecting the inclined portion. A specific example will be described below.

FIG. 7A is a perspective view showing an example of the shape of the plate 9 in this embodiment. The plate 9 can be formed of a light transmissive material in consideration of a light irradiation step, and have a circular shape with a diameter of 300 mm (inclusive) to 500 mm (inclusive). In the plate 9, for the purpose of uniform spreading of the material to the outer peripheral portion of the substrate during the planarization process, an inclined portion is formed in the outer peripheral portion on the side of the tight contact surface (first surface) which is to contact a substrate.

FIG. 7B is a top view of the plate 9, and FIG. 7C is a side view showing the end face of the plate 9. Let T1 be the inclination start position from the plate center side in an inclined portion S1 connecting an end face 32 of the plate 9 and the plane of a first surface 9a of the plate 9. Further, let T2 be the inclination start position from the plate center side in an inclined portion S2 connecting the end face 32 of the plate 9 and the plane of a second surface 9b of the plate 9. Note that the inclined portion S2 may not be formed. θ1 indicates the inclination angle of the inclined portion S1 on the side of the tight contact surface (first surface 9a) of the plate 9 which is to contact a substrate. θ2 indicates the inclination angle of the inclined portion S2 on the side of the second surface 9b of the plate 9. θ1 and θ2 are not equal to each other. For example, for the purpose of uniform spreading of the material to the outer peripheral portion of the substrate during the planarization process, θ1 is smaller than θ2.

Figure 8A:
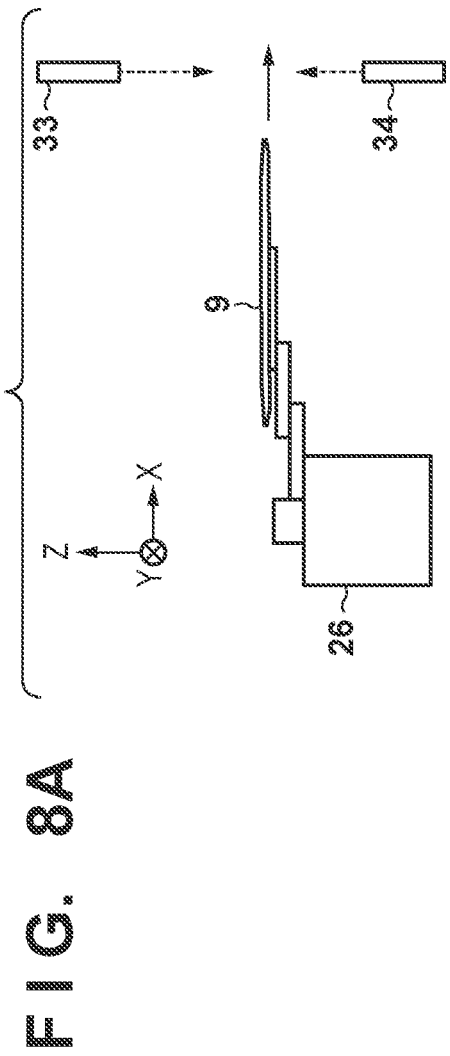
FIGS. 8A to 8E are views for explaining a plate front/back determination method according to the second embodiment.
Figure 8B:
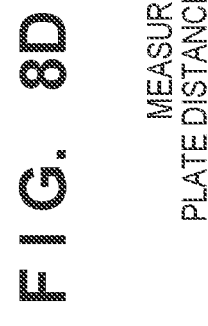
Figure 8C:
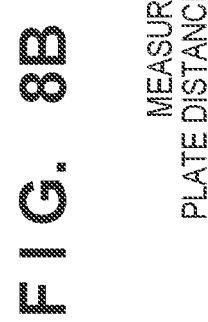
Figure 8D:
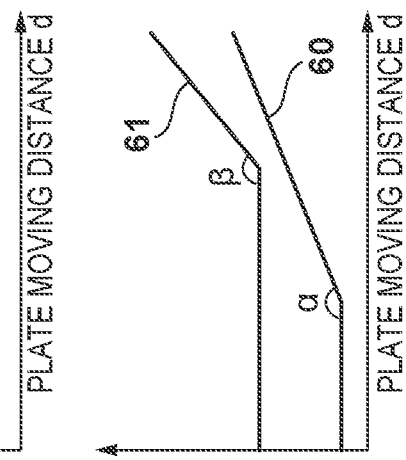
Figure 8E:
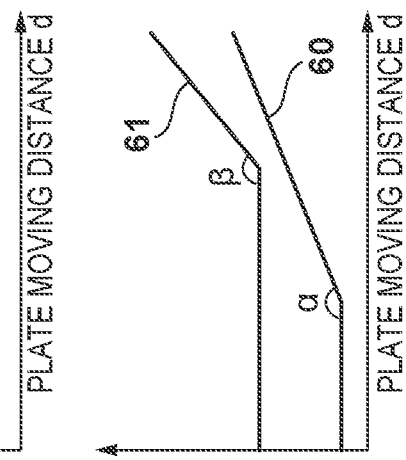

With reference to FIGS. 8A to 8E, the front/back determination method of the plate 9 according to this embodiment will be described. As shown in FIG. 8A, two displacement sensors 33 and 34 as measurement devices are arranged at positions vertically facing each other with respect to the plate 9. The two displacement sensors 33 and 34 are arranged equidistant from the plate 9. The plate 9 held by a conveyance hand 26 is conveyed into the measurement range of the two displacement sensors 33 and 34. It is desirable that the two displacement sensors are arranged at identical positions in the horizontal direction (X and Y directions). The determiner 27 performs the front/back determination by detecting the inclined portion based on the measurement results of the two displacement sensors 33 and 34 upon scanning the plate 9. FIG. 8B shows a measurement graph in a case of measuring the distance while the plate 9 is inserted between the two displacement sensors 33 and 34. The abscissa represents the plate movement distance, and the ordinate represents the measured plate distance. The measured value (distance) of the plate outer peripheral portion measured by each of the two displacement sensors 33 and 34 changes in accordance with the inclination angle of the inclined portion of the plate 9. The smaller the inclination angle θ1, the larger an inclination α of a graph 60 regarding the plate movement distance and the measured plate distance. To the contrary, the larger the inclination angle θ2, the smaller an inclination β of a graph 61. The distances to the plate outer peripheral portion are simultaneously measured using the two displacement sensors 33 and 34 and, if α>β, it can be determined that the upper surface of the plate 9 is the first surface (front surface) and the lower surface is the second surface (back surface). To the contrary, if α<β, it can be determined that the upper surface of the plate is the back surface and the lower surface is the front surface. FIG. 5C shows a case in which the two displacement sensors 33 and 34 are arranged at different distances from the plate 9. Also in this arrangement, the front surface/back surface can be determined based on the difference in inclination. Each of FIGS. 5D and 5E is a graph showing the plate movement distance and the measured plate distance in a case of moving the plate in the direction away from the two displacement sensors 33 and 34 by the conveyance hand 26. Also in this case, the front/back determination can be performed based on the inclination between the plate movement distance and the measured plate distance.

Accordingly, the front/back of the plate 9 can be determined in both cases of loading and unloading the plate 9 with respect to the two displacement sensors 33 and 34 by the conveyance hand 26. Note that the positions of the two sensors 33 and 34 may not be equidistant from the plate 9. For example, by measuring, in advance, the difference between the distances of the both sensors from the plate 9 and using the difference as a correction value in the determination, the both sensors need not be arranged equidistant from the plate 9.

Figure 9A:
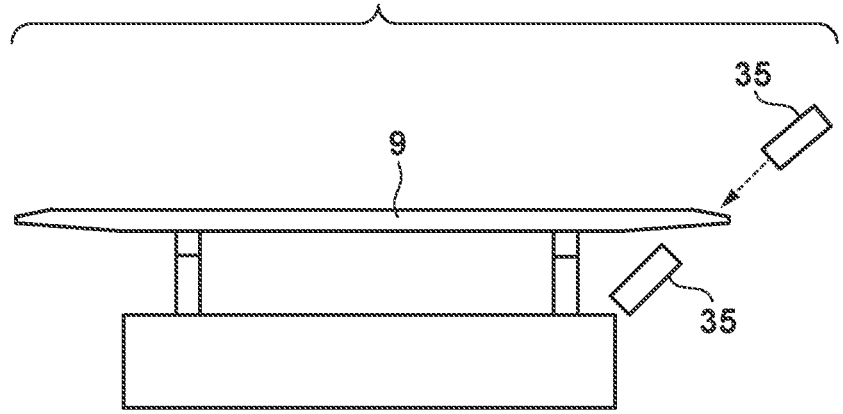
FIGS. 9A to 9C are views showing a modification of the arrangement of a measurement device.

FIG. 9A shows a modification of the arrangement of the measurement devices shown in FIG. 8A. In FIG. 9A, photoelectric sensors 35 are arranged at predetermined positions from the upper surface and the lower surface of the plate outer peripheral portion, respectively. The inclined portion in the plate outer peripheral portion is irradiated with light from the photoelectric sensor 35. The front/back determination of the plate 9 is performed based on the refraction angle of the light entering from the inclined portion and transmitted through the plate 9. For example, a projector of the photoelectric sensor 35 is arranged above the plate, and the light transmitted through the plate 9 enters the receiver-side sensor arranged on the side of the plate lower surface.

Figure 9B:
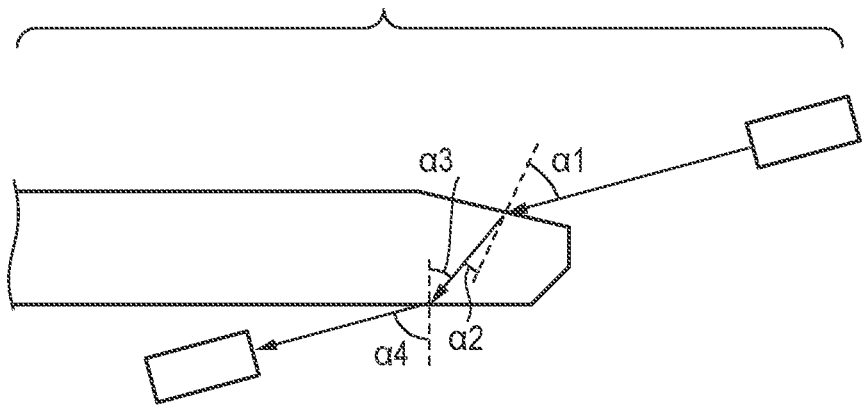

FIG. 9B is a view schematically showing the optical path of the light emitted to the inclined surface of the plate upper surface. The light travels with an incident angle α1 at the boundary surface between the air and the plate, which becomes a refraction angle α2 in the plate. The light having travelled in the plate has an incident angle α3 at the boundary surface between the plate 9 and the air, and is emitted into the air at a refraction angle α4. The light having the refraction angle α4 is received by the light receiving side sensor.

Figure 9C:
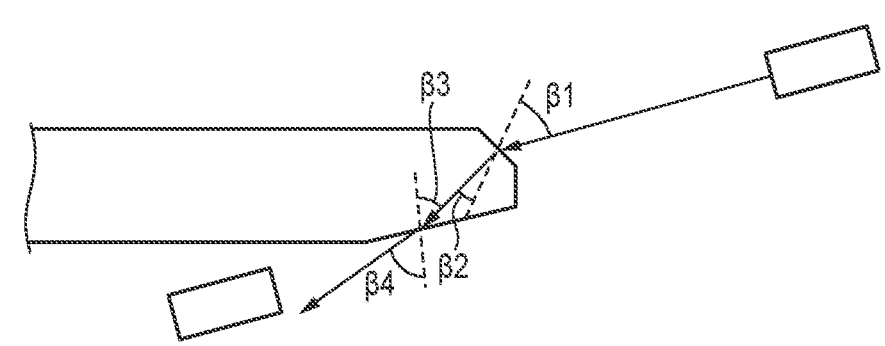

FIG. 9C is a view schematically showing the optical path of the photoelectric sensor in a case in which the plate 9 is turned over in the state in which the photelectric sensors are arranged as in FIG. 9B. The light travels with an incident angle β1 at the boundary surface between the air and the plate, which becomes a refraction angle β2 in the plate. The light having traveled in the plate has an incident angle β3 at the boundary surface between the plate 9 and the air, and is emitted into the air at a refraction angle β4. The light having the refraction angle β4 is not received by the light receiving side sensor. Thus, when the measurement is performed with the plate 9 in the turn-over state, due to the different inclination angles of the inclined portions, the light emitted from the light projecting side cannot be received by the light receiving side sensor. Therefore, the front/back of the plate 9 can be determined based on whether the light can be received. Note that in the example shown in FIG. 9, the light projecting side sensor is arranged above the plate and the light receiving side sensor is arranged below the plate, but the arrangement may be reversed.

Third Embodiment

Figure 10A:
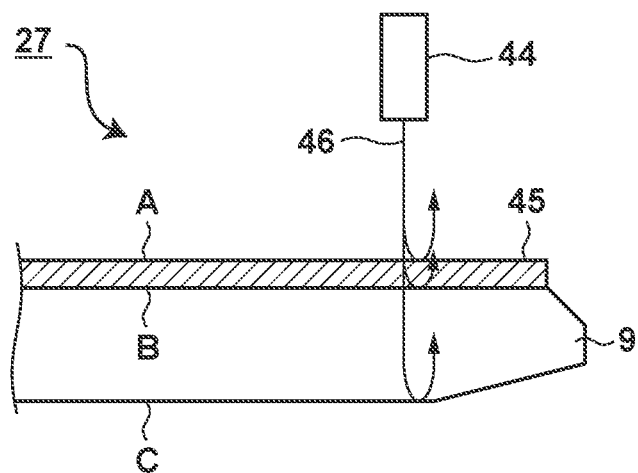
FIGS. 10A to 10C are views for explaining a plate front/back determination method according to the third embodiment.
Figure 10B:
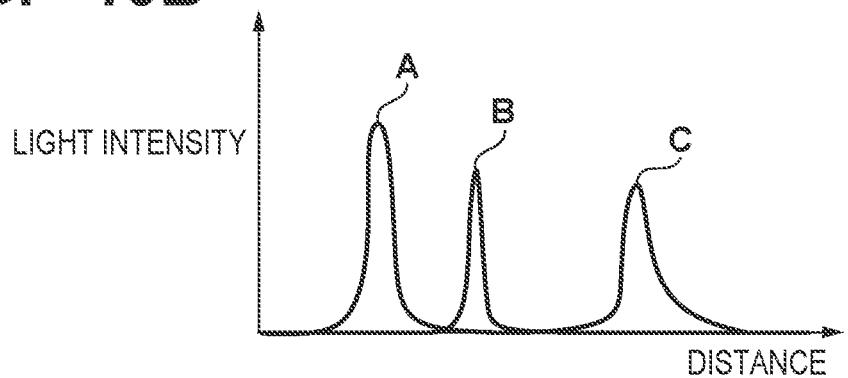
Figure 10C:
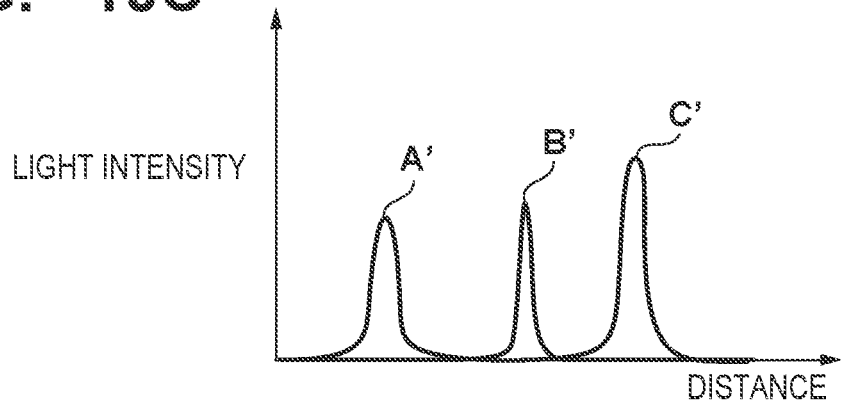

With reference to FIGS. 10A to 10C, a plate front/back determination method according to the third embodiment will be described. In the third embodiment, a coating film is formed on the first surface of a plate 9, and the intensity distribution of reflected light upon emitting light toward the upper surface of the plate is measured. A determiner 27 performs the front/back determination based on the measurement result. A specific example will be described below.

FIG. 10A is a view showing the arrangement of the determiner 27 according to this embodiment. The determiner 27 is formed by a plate chuck (not shown) and a displacement meter 44 serving as a measurement device. The plate chuck holds the plate 9. The displacement meter 44 can include, for example, a spectral interferometer (spectacle interference laser displacement meter). Alternatively, the displacement meter 44 can include a multi-layer film thickness measurement device. The displacement meter 44 is arranged above the plate 9, and is configured to emit light toward the upper surface of the plate 9. The plate 9 is coated with a coating material 45 for the purpose of protecting the surface from damage and facilitating a separation of the plate 9 from a cured material. The thickness of the coating material 45 is sufficiently smaller than the thickness of the plate 9. The light emitted from the displacement meter 44 is reflected by each of a front surface A of the coating material 45, a front surface B of the plate 9 with the coating material 45 coated thereon, and a back surface C of the plate 9, and returns to the displacement meter 44. An optical path 46 indicates the light reflected by the respective surfaces.

FIG. 10B is a graph showing the optical path length and the light intensity measured by the displacement meter 44. Each of the positions of the plate 9 and the surface of the coating material 45 is indicated by the optical path length and the peak of the light intensity. Since the coating material 45 is thinner than the plate 9, the distance between the front surface B of the plate 9 and the back surface C of the plate 9 is larger than the distance between the front surface A of the coating material 45 and the front surface B. FIG. 10C is a graph showing the optical path length and the light intensity measured by the displacement meter 44 when the plate 9 is reversed. The light emitted by the displacement meter 44 is reflected by each of a back surface A' of the plate 9, a front surface B' of the plate 9, and a front surface C' of the coating material 45 and returns to the displacement meter 44. With this, the arrangement of the plate 9 and the coating material 45 can be determined. In this manner, the front/back of the plate 9 can be determined based on the respective optical path lengths and the positions of the peaks of the light intensity.

In the above-described embodiment, a planarization apparatus 100 includes the determiner 27 that determines whether the upper surface of the plate 9 placed on a predetermined placement surface is the first surface including a flat surface or the second surface on the opposite side of the first surface. However, the determiner 27 may be implemented in, for example, an adjuster 30.

Embodiment of Article Manufacturing Method

A method of manufacturing an article (a semiconductor IC element, a liquid crystal display element, a color filter, a MEMS, or the like) by using the above-described planarization apparatus will be described next. The manufacturing method includes, by using the above-described planarization apparatus, a step of planarizing a composition by bringing the composition arranged on a substrate (a wafer, a glass substrate, or the like) and a mold into contact with each other, a step of curing the composition, and a step of separating the composition and the mold from each other. With this, a planarized film is formed on the substrate. Then, processing such as pattern formation using a lithography apparatus is performed on the substrate with the planarized film formed thereon, and the processed substrate is processed in other known processing steps to manufacture an article. Other known steps include etching, resist removal, dicing, bonding, packaging, and the like. This manufacturing method can manufacture an article with higher quality than the conventional methods.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-109414, filed Jun. 30, 2021, which is hereby incorporated by reference herein in its entirety.

What is claimed is:

1. A conveyance apparatus that loads a pressing member to a planarization apparatus that forms a planarized film made of a material on a substrate by bringing a flat surface of the pressing member and the material on the substrate into contact with each other, the pressing member including a first surface including the flat surface, and a second surface on an opposite side of the first surface, the conveyance apparatus comprising:
   a determiner configured to perform determination as to whether a determination surface of the pressing member is the first surface or the second surface; and
   a controller configured to control the conveyance of the pressing member based on a result of the determination by the determiner,
   wherein the determiner is configured to perform the determination in a state in which the pressing member is placed on a predetermined placement surface.

2. The conveyance apparatus according to claim 1, further comprising
   a reversing device configured to turn over the pressing member,
   wherein the controller is configured to control the conveyance of the pressing member to convey the pressing member to the reversing device in accordance with a result of the determination by the determiner.

3. The conveyance apparatus according to claim 2, wherein
   the planarization apparatus includes a holder configured to hold the pressing member by chucking the second surface in a state in which the second surface of the pressing member faces upward, and a forming device configured to form the planarized film using the pressing member held by the holder, and
   the controller is configured to control the conveyance of the pressing member to:
   convey the pressing member to the reversing device in a case that the determiner determines that the determination surface of the pressing member is the first surface, and
   convey the pressing member reversed by the reversing device to the forming device, and convey the pressing member to the forming device without reversing the pressing member by the reversing device in a case that the determiner determines that the determination surface of the pressing member is the second surface.

4. The conveyance apparatus according to claim 2, further comprising
   an adjuster configured to adjust a prealignment state of the pressing member, and
   the planarization apparatus includes a holder configured to hold the pressing member by chucking the second surface in a state in which the second surface of the pressing member faces upward, and a forming device configured to perform a forming process of the planarized film using the pressing member held by the holder, and
   the controller is configured to control the conveyance of the pressing member to:
   convey the pressing member to the pressing member in a case that the determiner determines that the determination surface of the pressing member is the first surface, convey the pressing member reversed by the reversing device to the adjuster, and convey the pressing member adjusted by the adjuster to the forming device, and
   convey the pressing member to the adjuster without reversing the pressing member by the reversing device in a case that the determiner determines that the determination surface of the pressing member is the second surface, and convey the pressing member adjusted by the adjuster to the forming device.

5. The conveyance apparatus according to claim 1, wherein
the pressing member is formed with a mark for identifying one of the first surface and the second surface, and
the determiner is configured to perform the determination by detecting the mark.

6. The conveyance apparatus according to claim 5, further comprising
an image capturing device configured to capture the mark,
wherein the determiner is configured to perform the determination by processing an image of the mark extracted from an image obtained by the image capturing device.

7. The conveyance apparatus according to claim 1, wherein
an inclined portion is formed in an outer edge portion of the first surface of the pressing member, and
the determiner is configured to perform the determination by detecting the inclined portion.

8. The conveyance apparatus according to claim 7, further comprising
a measurement device configured to measure a front surface of the pressing member,
wherein the determiner is configured to perform the determination by detecting the inclined portion based on a measurement result of the measurement device upon scanning the pressing member.

9. The conveyance apparatus according to claim 1, wherein
a coating film is formed on the first surface of the pressing member, and
the conveyance apparatus further comprises a measurement device configured to measure an intensity distribution of reflected light obtained when light is emitted toward the determination surface of the pressing member, and
the determiner is configured to perform the determination based on a measurement result of the measurement device.

10. The conveyance apparatus according to claim 9, wherein
the measurement device includes a spectral interferometer.

11. The conveyance apparatus according to claim 9, wherein
the measurement device includes a multi-layer film thickness measurement device.

12. An article manufacturing method comprising:
forming a planarized film on a substrate using a pressing member loaded to a planarization apparatus by a conveyance apparatus defined in claim 1; and
processing the substrate with the planarized film formed thereon,
wherein an article is manufactured from the processed substrate.

13. A planarization apparatus that forms a planarized film made of a material on a substrate by bringing a flat surface of a pressing member and the material on the substrate into contact with each other, the pressing member including a first surface including the flat surface, and a second surface on an opposite side of the first surface, the apparatus comprising:
a determiner configured to perform determination as to whether a determination surface of the pressing member is the first surface or the second surface, and
a controller configured to control conveyance of the pressing member based on a result of the determination by the determiner,
wherein the determiner is configured to perform the determination in a state in which the pressing member is placed on a predetermined placement surface.

* * * * *